United States Patent
Kautzsch

(10) Patent No.: US 10,007,056 B2
(45) Date of Patent: Jun. 26, 2018

(54) SILICON LIGHT TRAP DEVICES, SYSTEMS AND METHODS

(71) Applicant: Infineon Technologies Dresden GmbH, Dresden (DE)

(72) Inventor: Thoralf Kautzsch, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days. days.

(21) Appl. No.: 15/390,178

(22) Filed: Dec. 23, 2016

(65) Prior Publication Data

US 2017/0115452 A1  Apr. 27, 2017

Related U.S. Application Data

(63) Continuation of application No. 13/654,917, filed on Oct. 18, 2012.

(51) Int. Cl.
| | |
|---|---|
| *H01L 31/00* | (2006.01) |
| *G02B 6/12* | (2006.01) |
| *G02B 6/122* | (2006.01) |
| *G02B 6/136* | (2006.01) |
| *H01L 31/0232* | (2014.01) |
| *H01L 31/054* | (2014.01) |

(52) U.S. Cl.
CPC ....... *G02B 6/12002* (2013.01); *G02B 6/1223* (2013.01); *G02B 6/136* (2013.01); *G02B 2006/121* (2013.01); *G02B 2006/12061* (2013.01); *H01L 31/02327* (2013.01); *H01L 31/0547* (2014.12)

(58) Field of Classification Search
CPC .... H01L 31/2327; H01L 31/547; Y02E 10/52
See application file for complete search history.

(56) References Cited

U.S. PATENT DOCUMENTS

| | | | |
|---|---|---|---|
| 5,100,478 A | 3/1992 | Kawabata | |
| 5,376,818 A * | 12/1994 | Kurtz ............... | H01L 29/16 |
| | | | 257/418 |
| 6,420,647 B1 | 7/2002 | Ji et al. | |
| 6,538,195 B1 | 3/2003 | Shi et al. | |
| 6,809,008 B1 | 10/2004 | Holm et al. | |
| 7,592,644 B2 | 9/2009 | Suzuki et al. | |
| 7,755,118 B2 | 7/2010 | Inoue | |
| 8,258,050 B2 | 9/2012 | Cho et al. | |
| 8,466,529 B2 | 6/2013 | Suzuki et al. | |
| 8,507,960 B2 | 8/2013 | Itonaga | |
| 8,766,156 B2 | 7/2014 | Kawashima et al. | |

(Continued)

OTHER PUBLICATIONS

Within—inside something; in or into the interior (Miriam-Webster dictionary, http://www.merriam-webster.com/dictionay/within, 2014).

(Continued)

*Primary Examiner* — Thomas L Dickey
(74) *Attorney, Agent, or Firm* — Schiff Hardin LLP

(57) ABSTRACT

Embodiments relate to buried structures for silicon devices which can alter light paths and thereby form light traps. Embodiments of the lights traps can couple more light to a photosensitive surface of the device, rather than reflecting the light or absorbing it more deeply within the device, which can increase efficiency, improve device timing and provide other advantages appreciated by those skilled in the art.

18 Claims, 4 Drawing Sheets

(56) References Cited

U.S. PATENT DOCUMENTS

| | | |
|---|---|---|
| 2005/0104163 A1 | 5/2005 | Weber et al. |
| 2007/0200492 A1 | 8/2007 | Cok et al. |
| 2010/0148940 A1 | 6/2010 | Gelvin et al. |
| 2010/0202206 A1 | 8/2010 | Seol et al. |
| 2010/0239983 A1 | 9/2010 | Sills et al. |
| 2011/0030779 A1* | 2/2011 | Wada .................. H01L 31/028 136/256 |
| 2011/0092061 A1 | 4/2011 | Ho et al. |
| 2011/0203663 A1 | 8/2011 | Prather et al. |
| 2011/0223734 A1 | 9/2011 | Davis et al. |
| 2012/0012741 A1 | 1/2012 | Vasylyev |
| 2013/0044082 A1 | 2/2013 | Lin et al. |
| 2014/0110805 A1 | 4/2014 | Kautzsch |
| 2014/0158199 A1 | 6/2014 | Vasylyev |
| 2014/0225215 A1 | 8/2014 | Chien et al. |

OTHER PUBLICATIONS

Buried—(2): b—to cover from view (Merriam-Wesbter dictionary, http://www.merriam-webster.com/dictionary/bury, 2014).

Definition of immeidiately downloaded from http://www.merriam-webster.com/dictionary/immediately on Nov. 27, 2016.

* cited by examiner

SILICON LIGHT TRAP DEVICES, SYSTEMS AND METHODS

TECHNICAL FIELD

The invention relates generally to silicon devices and more particularly to optoelectronic silicon devices.

BACKGROUND

In optoelectronic devices, light rays are absorbed and generate charge carriers within the device. These charge carriers typically are desired to be generated within a particular light ray absorption region, which can be defined by a depth within the device, such that they can be collected near the surface of the device.

Charge carriers generated deeper than the depth of this region can be thought of us undesirable noise. Conventional approaches to dealing with these charge carriers often relate to transporting them to the surface by extended electric fields or annihilating them by the targeted introduction of recombination centers. The former is not suitable in all situations, such as those with regions that must remain free of electrical fields for physical reasons, and is also limited by available voltage, while the latter reduces internal quantum efficiency and can be technically difficult to realize at very high impurity atom densities. Reduced quantum efficiency in turn can affect devices dimensions, and increased complexity and technological challenges can increase costs, which are undesired.

SUMMARY

Embodiments relate to light trap devices, systems and methods.

In an embodiment, a device comprises a silicon structure having a surface to be exposed to light rays; and a light trap structure formed within the silicon structure spaced apart from the surface and comprising a plurality of light trap elements adjacent one another and each having a surface proximate to and unparallel with the surface to be exposed to light rays.

In an embodiment, a light trap structure buried within a silicon structure and comprises a plurality of light trap elements adjacent one another and each having a surface proximate to and unparallel with a surface of the silicon structure to be exposed to light rays.

In an embodiment, a method comprises providing a silicon structure; and forming a plurality of light trap elements adjacent one another in the silicon structure and each having a surface proximate to and unparallel with a surface of the silicon structure to be exposed to light rays.

BRIEF DESCRIPTION OF THE DRAWINGS

The invention may be more completely understood in consideration of the following detailed description of various embodiments of the invention in connection with the accompanying drawings, in which.

Figure 1:
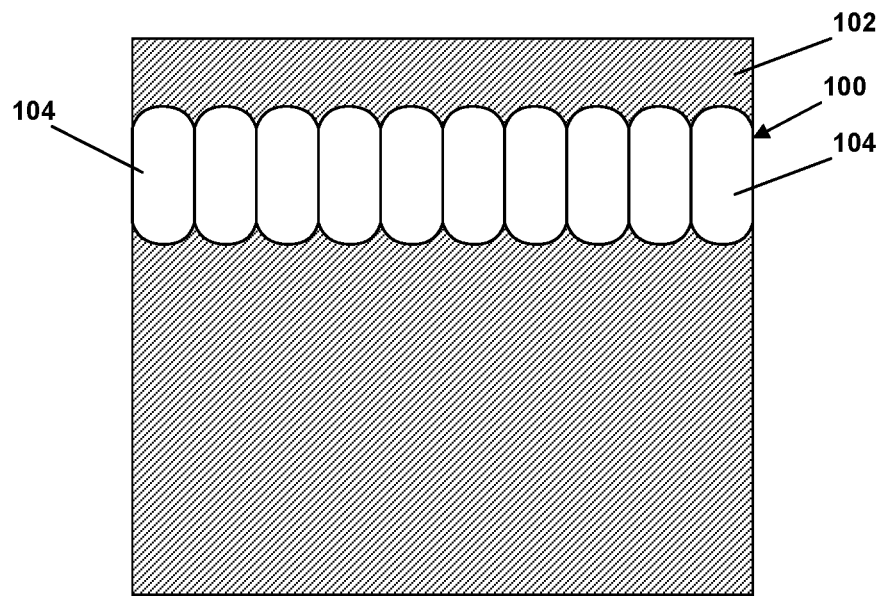
FIG. 1 is a side cross-sectional view of a light trap structure in a silicon structure according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to buried structures for silicon devices which can alter light paths and thereby form light traps. Embodiments of the lights traps can couple more light to a photosensitive surface of the device, rather than reflecting the light or absorbing it more deeply within the device, which can increase efficiency, improve device timing and provide other advantages appreciated by those skilled in the art.

Referring to FIG. 1, an embodiment of a light trap structure 100 embedded in a silicon structure 102 is depicted. Silicon structure 102 can comprise or consist of silicon in various embodiments, and in still other embodiments can comprise material(s) other than silicon. Light trap structure 100 comprises a plurality of light trap elements 104 arranged immediately adjacent one another. Light trap elements 104 can have length and/or width dimensions of about 0.5 μm to about 3 μm, height dimensions of about 1 μm to about 5 μm, and be disposed about 0.7 μm to about 50 μm from a top surface of silicon structure 102 in embodiments, though these dimensions can vary in other embodiments. For example, light trap elements 104 can be formed from trenches that extend partially, substantially or entirely along a length of silicon structure 102.

Figure 2:
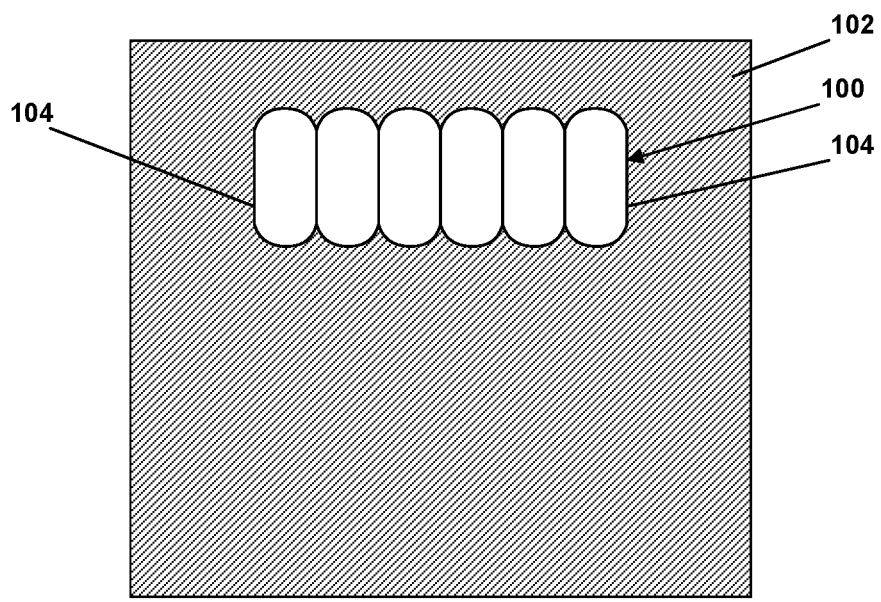
FIG. 2 is a side cross-sectional view of a light trap structure in a silicon structure according to an embodiment.

In embodiments, light trap elements 104 comprise cavities filled with air or some other suitable gas or material. Light trap structure 100 also can comprise a single light trap element 104 having the overall outline shape of structure 100 depicted in FIG. 1 but with the individual cavities being linked or joined to form a single cavity structure. Light trap structure 100 can comprise a single row of light trap elements 104 or a matrix of light trap elements, for example comprising four rows having eight elements 104 each. Though depicted in FIG. 1 as extending from one side of silicon structure 102 to the other, in other embodiments light trap structure can be formed in only a portion of silicon structure 102, such as is depicted in FIG. 2.

Figure 3:
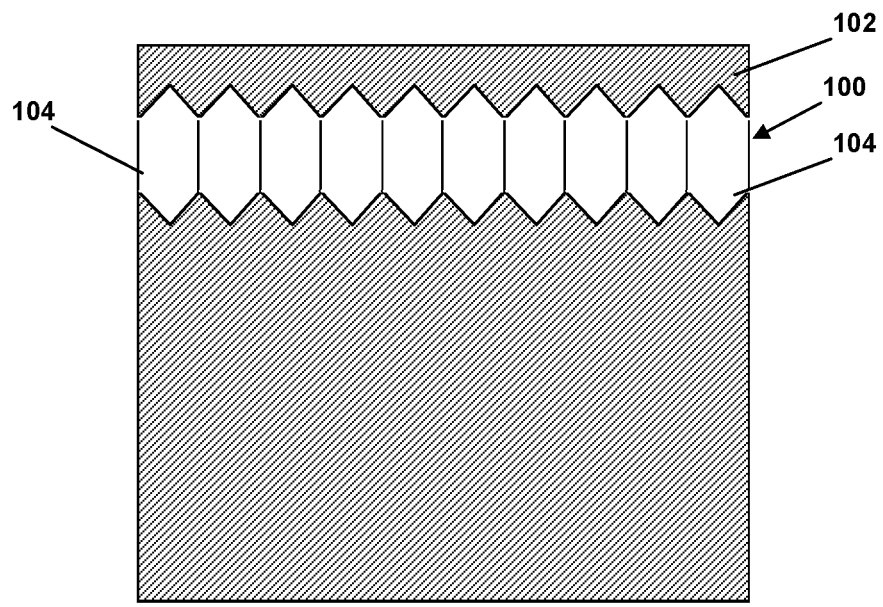
FIG. 3 is a side cross-sectional view of a light trap structure in a silicon structure according to an embodiment.

In the embodiment of FIG. 1, light trap elements 104 comprise curved, rounded or arched top and bottom (with respect to the depiction of the drawing on the page) portions. In other embodiments, only the top can be curved and the bottom can have some other shape or structure, for example being generally flat and therefore parallel with a top surface of silicon structure 102. In still other embodiments, light trap elements 104 can have other shapes, such as peaked or pointed as depicted in FIG. 3. In general, however, it can be seen that the surface of each light trap element 104 adjacent or opposing the upper surface of silicon structure 102 are angled, curved or otherwise unparallel with that upper surface.

The particular radius of curvature (FIGS. 1 and 2) or angle (FIG. 3) of the surfaces of light trap elements 104 can vary in embodiments according to materials used, light wavelengths and other factors. For example, silicon has a relatively high refractive index, such as between about 3.5 and 5.5 depending upon the wavelength of light. For a light wavelength of about 850 nm, a critical angle of about 16 degrees exists: all light rays impinging from silicon structure 102 on an interface with a vacuum or air layer at an angle greater than about 16 degrees will be totally reflected. Thus, light rays which enter silicon structure 102 and are reflected internally at an angle greater than 16 degrees will be subject to total reflection within silicon structure 102. In other embodiments, silicon structure 102 can comprise some other material, such as germanium, gallium arsenide, another 3-5 group semiconductor material, or another suitable material. Germanium and gallium arsenide, for example, generally have high refraction indices, like silicon, such that the total reflection angle will be below about 20 degrees in these embodiments as well, though one skilled in the art will appreciate that the angle can vary according to the properties of the material(s) used.

Figure 4:
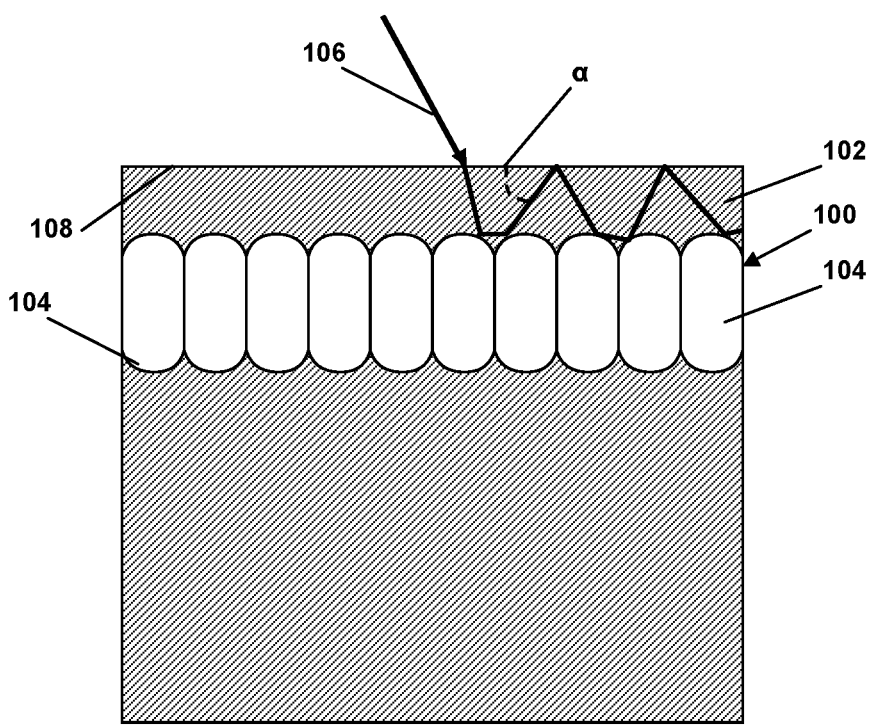
FIG. 4 is a side cross-sectional view of a light ray striking a silicon structure having a light trap structure according to an embodiment.

Referring to FIG. 4, a light ray 106 impinging on silicon structure 102 is reflected by light trap structure 100 back toward the surface 108, which is a silicon-air interface. Because of the arched structure of the light trap elements 104, ray 106 impinges on surface 108 from within silicon structure 102 at an angle α greater than about 16 degrees. This causes ray 106 to be reflected back toward light trap structure 100, which again causes ray 106 to strike surface 108 at an angle greater than about 16 degrees and be reflected internally. This internal reflection caused by altering the path of light ray 106 by light trap structure 100 can improve the efficiency of the device because a larger portion of light impinging on the device can be used by the device, such as by coupling more light to a photo surface of the device rather than be reflected externally.

The embodiment of FIG. 3 also can provide advantages. For example, the peaked light trap elements 104 of FIG. 3 can be more efficient by presenting a smaller portion of each element 104 which would cause the light to be reflected externally. In other words, the number of light rays striking the very peak of the light elements 104 generally will be very small, such that more light rays will be reflected internally similar to as depicted in FIG. 4.

Figure 5A:
FIG. 5A is a side cross-sectional view of a silicon structure according to an embodiment.
Figure 5B:
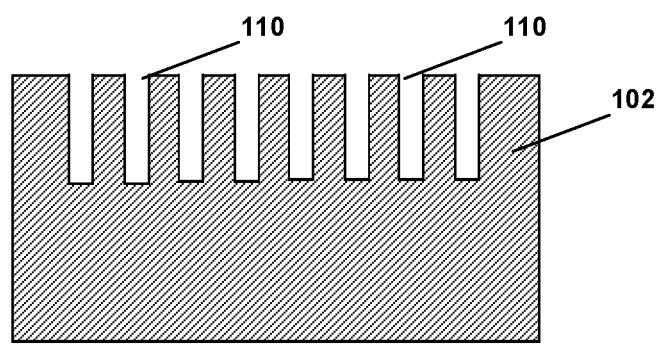
FIG. 5B is a side cross-sectional view of a plurality of trenches formed in a silicon structure according to an embodiment.
Figure 5C:
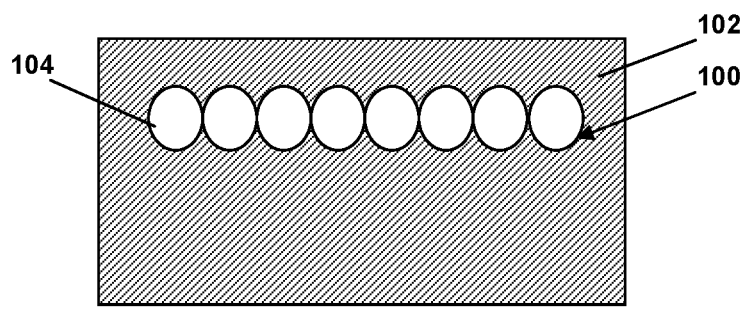
FIG. 5C is a side cross-sectional view of a plurality of cavities formed from the trenches of FIG. 5B according to an embodiment.
Figure 5D:
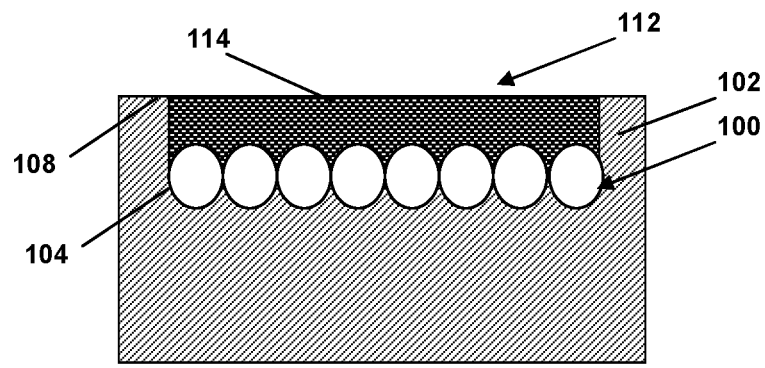
FIG. 5D is a side cross-sectional view of a photodetector device comprising a light trap structure according to an embodiment.

Referring next to FIGS. 5A-5D, one example process for forming light trap structure 100 is depicted. In one embodiment, a Venezia process for forming cavities in monocrystalline silicon can be used, though other processes can be used in this and other embodiments. In FIG. 5A, a silicon structure 102, such as a silicon wafer, is provided. In FIG. 5B, at least one trench 110 is etched in silicon structure 102. Silicon structure 102 is then exposed to a hydrogen atmosphere and a reflow process or epitaxy step, which results in the silicon-on-nothing structure 102 depicted in FIG. 5C, in which light trap elements 104 have been formed from each of the at least one trenches 110. FIG. 5D depicts one example of a final photo-sensitive structure 112, such as a photo diode, after formation of a photo detector 114 between light trap structure 100 and surface 108. As depicted in FIG. 5D, photo-sensitive structure 112 forms only a portion of surface 108, such as a photo-sensitive "window" of the device, though this can vary in other embodiments to include an entire surface or a plurality of photo-sensitive structures spaced apart at a surface or some other arrangement.

The process can vary for other embodiments, such as the peaked light trap structure 100 of FIG. 3. For such an embodiment, for example, silicon structure 102 and trenches 110 can be treated with an alkaline solution to anisotropically etch the silicon, thereby uncovering the (111) surface of the silicon, which results in the peaks of FIG. 3 as the angle of about 54.7 degrees between (100) and (111) planes of the silicon of silicon structure 102. Other surfaces of the silicon, such as the (110) surface, also can be used in embodiments to produce different angles of the peaks, which vary with the crystal orientation of the silicon, though other angles can be less efficient. For example, the angle can be between about 50 degrees and about 60 degrees, such as between about 53 and 56 degrees, for example about 54.7 degrees in embodiments.

Figure 6:
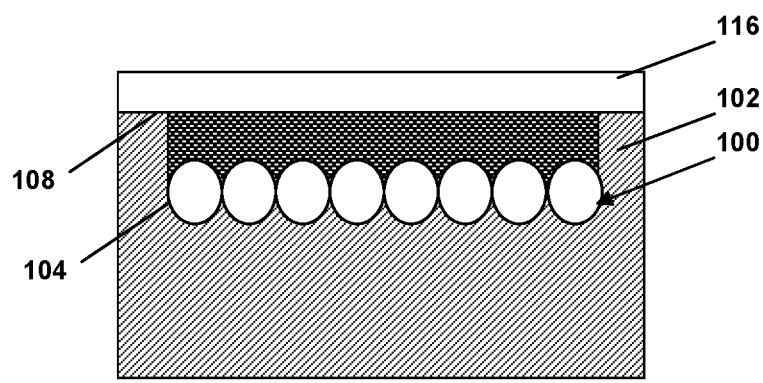
FIG. 6 is a side cross-sectional view of a light trap structure in a silicon structure having a light-focusing roof structure according to an embodiment.

Other features and elements can be incorporated in embodiments. For example, and referring to FIG. 6, a roof structure 116 can be used with light trap structure 100 to further maximize quantum efficiency. Such a roof structure 116 can be used in photovoltaics, such as high-powered solar cells, and other applications to better channel or focus light rays to photosensitive elements below. In embodiments, roof structure 116 comprises a plurality of inverted pyramid, funnel or other light-focusing structures and can be formed by a masked potassium hydroxide solution etch or some other suitable process step(s). Roof structure 116 need not be a separate layer as depicted but instead can be an area or portion of silicon structure 102 that is etched, patterned or otherwise altered to include one or more light-focusing structures. In another example, light trap structure 100 can comprise a thermal liner oxide layer in order to electrically passivate the interface between surface 108 and/or to electrically insulate the region from the substrate below. Using roof structure 116 and/or a thermal liner oxide layer in combination with a light trap structure can thereby provide benefits in embodiments.

Embodiments thereby provide improved light trap structures for silicon devices which can alter light paths. Embodiments of the lights traps can couple more light to a photosensitive surface of the device, rather than reflecting the light or absorbing it more deeply within the device, which can increase efficiency, improve device timing and provide other advantages appreciated by those skilled in the art.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method of forming a silicon-on-nothing structure, comprising:
    providing a silicon structure;
    etching a plurality of trenches in the silicon structure;
    exposing the silicon structure to a hydrogen atmosphere;
    performing reflow or epitaxy,
    wherein a light trap structure comprised of respective light trap elements is formed from the plurality of trenches; and
    forming a roof structure on the light trap structure.
2. The method of claim 1, further comprising:
    forming a plurality of light-focusing structures in the roof structure.
3. The method of claim 2, wherein the forming of the plurality of light-focusing structures comprises etching the roof structure.
4. The method of claim 3, wherein the etching the roof structure comprises etching using a masked potassium hydroxide solution.
5. The method of claim 2, wherein the light-focusing structures are shaped as inverted pyramid structures.
6. The method of claim 2, wherein the light-focusing structures are shaped as funnel structures.
7. The method of claim 1, wherein the roof structure is a separate layer.
8. The method of claim 1, wherein the roof structure is formed in a portion of the silicon structure.
9. The method of claim 1, further comprising:
    forming a thermal liner oxide layer in the light trap structure.
10. A method of forming a silicon-on-nothing structure, comprising:
    providing a silicon structure;
    etching a plurality of trenches in the silicon structure;
    exposing the silicon structure to a hydrogen atmosphere; and
    performing reflow or epitaxy, wherein a light trap structure comprised of respective light trap elements is formed from the plurality of trenches; and
    forming a photo-detector between the light trap structure and the surface of the silicon-on-nothing structure.
11. The method of claim 10, wherein the silicon-on-nothing structure is a photo-sensitive structure.
12. The method of claim 11, wherein the photo-sensitive structure is a photodiode.
13. The method of claim 11, wherein the photo-sensitive structure is a solar cell.
14. The method of claim 11, wherein the photo-sensitive structure forms only a portion of the surface of the silicon-on-nothing structure.
15. The method of claim 11, wherein the photo-sensitive structure forms an entire surface of the silicon-on-nothing structure.
16. The method of claim 11, wherein the photo-sensitive structure comprises a plurality of photo-sensitive structures spaced apart from one another.
17. The method of claim 16, wherein all of the plurality of photo-sensitive structures are formed at the surface of the silicon-on-nothing structure.
18. The method of claim 16, wherein only some of the plurality of photo-sensitive structures are formed at the surface of the structure.

* * * * *